United States Patent [19]

Baron

[11] 4,142,245

[45] Feb. 27, 1979

[54] MULTI-FREQUENCY DIGITAL WAVE SYNTHESIZER FOR PROVIDING ANALOG OUTPUT SIGNALS

[75] Inventor: Robert P. Baron, Houston, Tex.

[73] Assignee: Texas Instruments Incorporated, Dallas, Tex.

[21] Appl. No.: 826,484

[22] Filed: Aug. 22, 1977

[51] Int. Cl.² .......................... G06F 1/02; G06G 7/26
[52] U.S. Cl. .................... 364/900; 328/14; 364/721
[58] Field of Search .............. 364/900 MS File, 718, 364/721; 328/14, 27; 340/347 DA; 307/260, 261, 265

[56] References Cited

U.S. PATENT DOCUMENTS

| | | | |
|---|---|---|---|
| 3,633,017 | 1/1972 | Crooke et al. | 364/721 |
| 3,727,037 | 4/1973 | Zorn | 364/721 X |
| 3,735,269 | 5/1973 | Jackson | 328/14 |
| 3,813,528 | 5/1974 | Blanding | 364/721 X |
| 3,898,446 | 8/1975 | Vatz | 364/721 X |
| 4,001,557 | 1/1977 | Stephenson | 364/718 X |
| 4,024,385 | 5/1977 | Richards | 364/721 X |
| 4,039,806 | 8/1977 | Fredriksson et al. | 364/721 |
| 4,064,423 | 12/1977 | Atkisson, Jr. | 364/718 |

*Primary Examiner*—Melvin B. Chapnick
*Attorney, Agent, or Firm*—Rene' E. Grossman; Thomas G. Devine

[57] ABSTRACT

A digital wave synthesizer provides one of a plurality of available analog output signals in response to and corresponding to a digital input signal. Each of the available plurality of analog output signals is made up of n successive segments of periods A and B. Segment information is stored in a logic array in such a manner that the segment number and the desired frequency output provides any of the n segments of any of the plurality of analog output signals with the appropriate A or B period. The successive order of segments is not altered by a change in the digital input signal requiring a change in the output signal frequency. An increase in frequency simply requires that a succeeding segment have a shorter A or B period and that a lower frequency have a longer A or B period. The voltage provided in a voltage distribution network is always the same for a particular number of segments irrespective of the output frequency required. Therefore, when a frequency change is required, there is no voltage shift.

46 Claims, 9 Drawing Figures

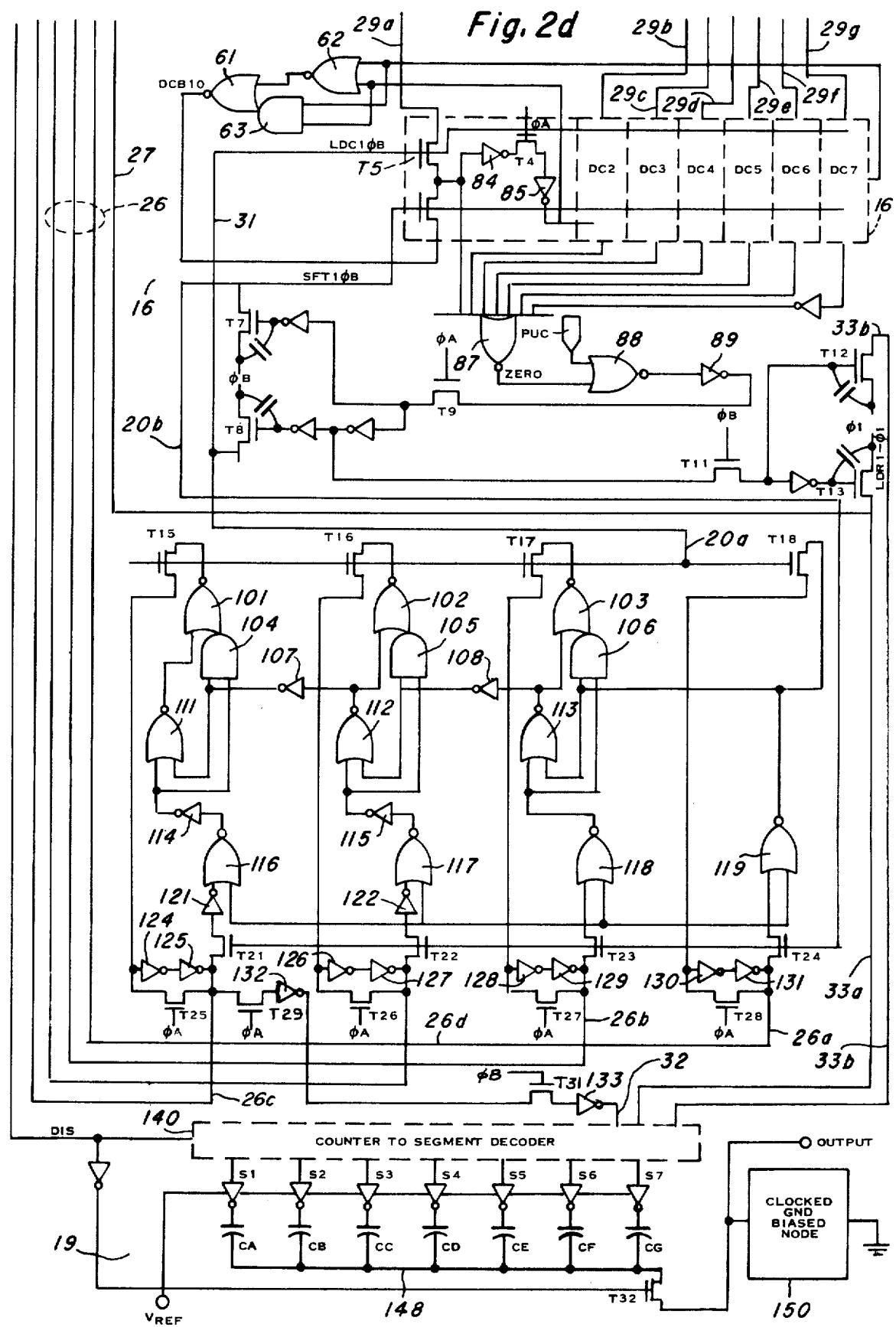

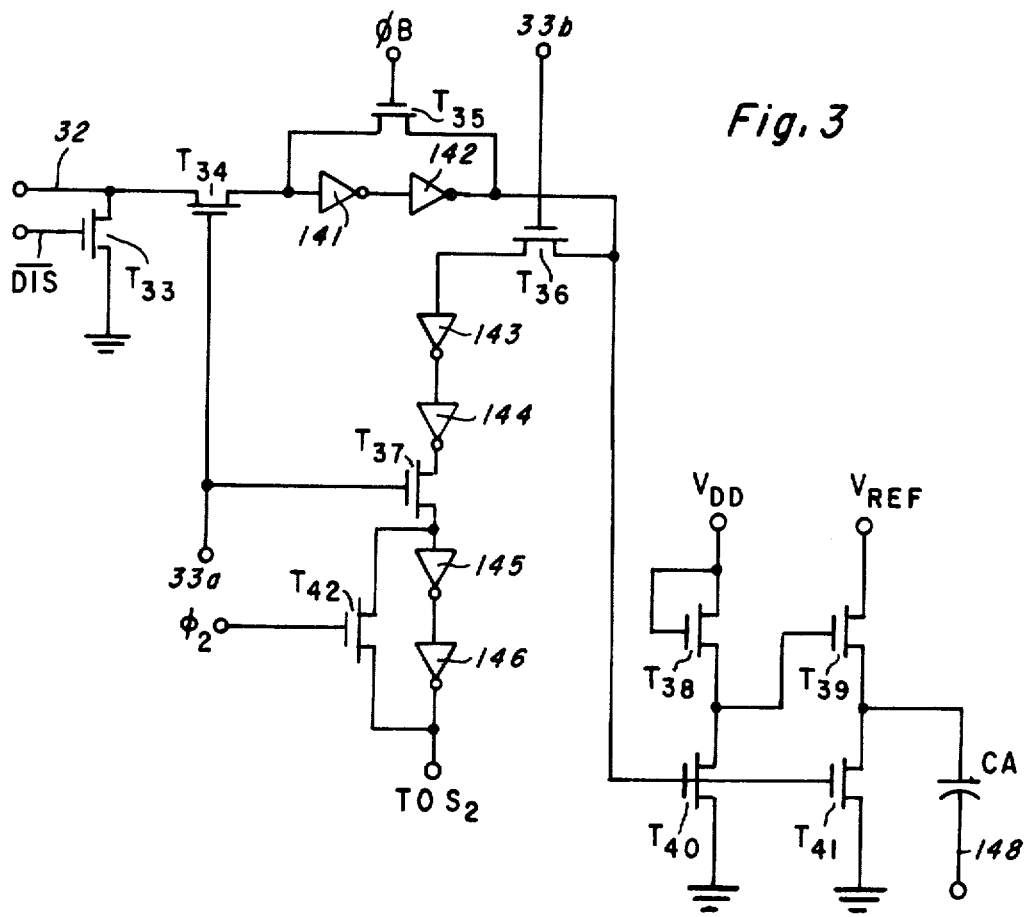

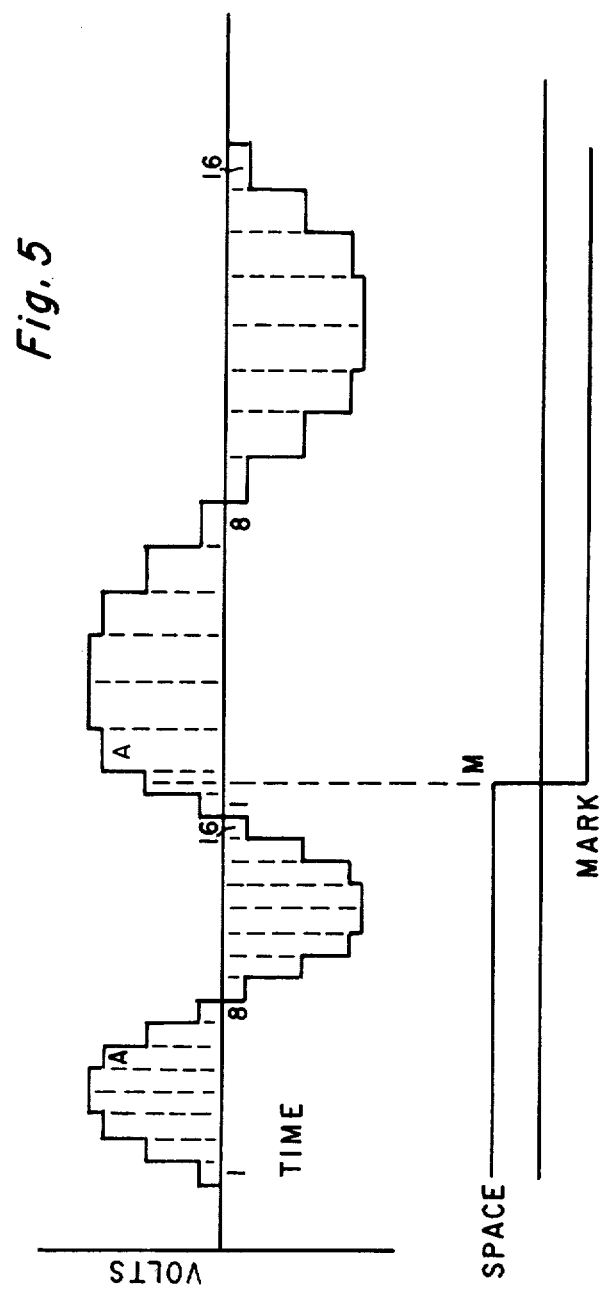

4,142,245

MULTI-FREQUENCY DIGITAL WAVE SYNTHESIZER FOR PROVIDING ANALOG OUTPUT SIGNALS

BACKGROUND OF THE INVENTION

1. Field of the Invention

This invention relates to digital wave synthesizers and more particularly to sine wave synthesizers in such devices as frequency shift keying transmitters.

2. Description of the Prior Art

In the prior art, it has been common practice to represent digital data in the form of a high frequency pulse train. Digital computers, for example, operate at extremely high speeds utilizing digital data in the form of bi-level pulses. Transmission of the pulses is generally done by changing from digital to analog.

In the past, producing a symmetrical analog waveform in response to a series of periodic pulses has been expensive in terms of necessary hardware and time. Also, when a change is made in the input from a "mark" to a "space", the sudden change in frequency causes an inordinate amount of noise. Also, such a shift in frequency often results in a sudden change in voltage, also contributing to noise.

Other prior art systems were devised wherein a separate generator provided one frequency for the "mark" input digital signal and another generator provided a second frequency for the "space" digital input. However, the point at which switching is done is unknown and therefore the noise problem as indicated above exists in this system as well.

In the instant invention, by assigning a predetermined voltage to each of the n segments irrespective of which of the plurality of output analog signals is being formed, and simply by varying the period of the segment as determined by which analog output signal is being formed, the above problems are minimized, if not eliminated.

BRIEF SUMMARY OF THE INVENTION

The preferred embodiment of this invention is for the synthesizing of a sine wave in a frequency shift keying transmitter wherein a binary "1" or "mark" results in a sine wave output of a given frequency and a binary "0" or "space" results in a sine wave of a different frequency. A plurality of pairs of frequencies corresponding to input digital signals are available and identification information is stored in a combination of read-only-memory (ROM) and programmable logic array (PLA). A selection of the frequency pair provides one address input to the ROM-PLA combination for either the "mark" frequency or the "space" frequency. A second address input is that of the segment number. The segment number plus the particular frequency desired provides an output of a binary representation of the period of the particular segment. Each segment of each available analog sine wave output has the same voltage assigned to it in the voltage distribution network output. Furthermore, the sequence of segments is never altered. Therefore, when a "mark" input appears to replace a "space" input, or vice versa, the next segment will follow with the same output voltage, but with a different period.

Each sine wave output is made up of n segments. The segments have periods of A and B. In any of the output sine waves $x+y = n$ where x is a number of segments having a period of A duration and y is a number of segments having a period of B duration.

$$1/f = Ax + By$$

In the preferred embodiment, n = 16 and x and y are integers. A and B are also integers, measured in microseconds with B equal to A+1.

By incorporating two distinct segment periods in a given output sine wave, the integrity of the sine wave can be vastly improved so that the frequency developed is almost exactly equal to the desired frequency.

BRIEF DESCRIPTION OF THE DRAWINGS

FIG. 3 is a schematic diagram of a stage of the counter to segment decoder and switch inverter S1 of FIG. 2.

FIG. 4 is a schematic diagram of the clocked ground biased node 150 of FIG. 2.

FIG. 5 illustrates, in exaggerated form, a decrease in frequency of a synthesized sine wave from a "mark" to a "space".

DETAILED DESCRIPTION OF THE INVENTION

Figure 1:
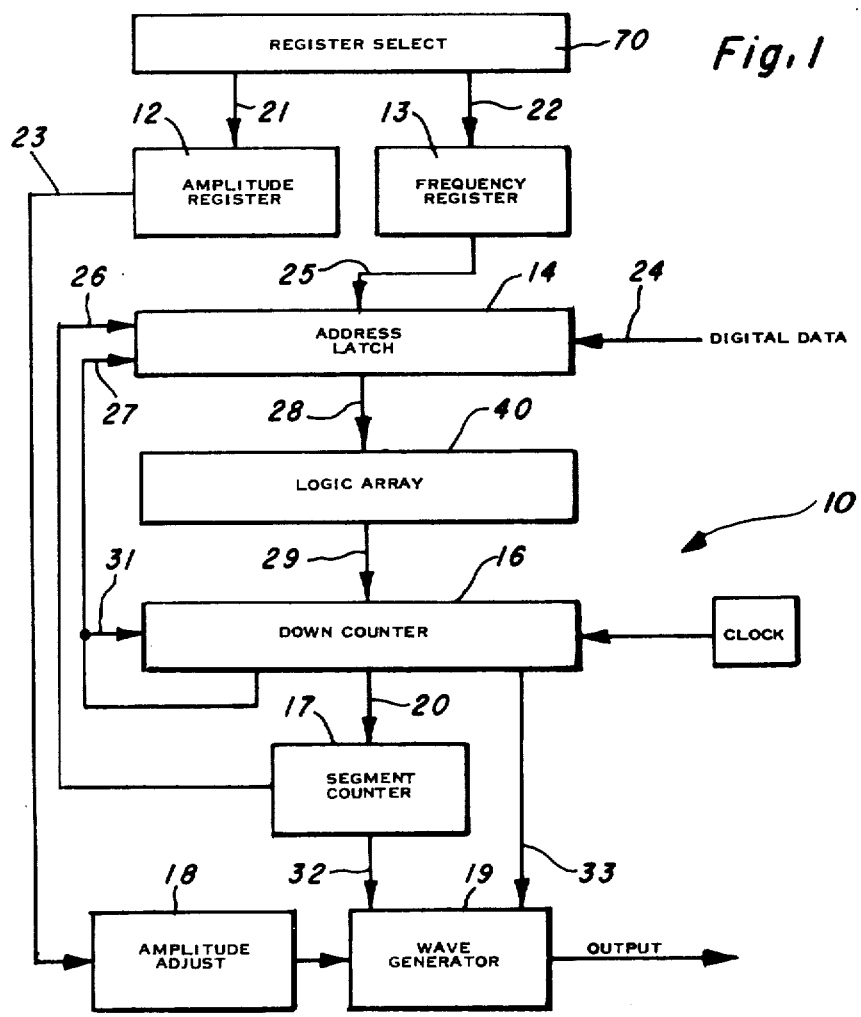
FIG. 1 is a block diagram depicting the digital wave synthesizer.

FIG. 1 illustrates the multi-frequency digital wave synthesizer 10 in block form. A register select 70 is shown having an output 21 to amplitude register 12 which in turn has an output 23 to amplitude adjust 18 which functions to provide a predetermined reference voltage on its output to wave generator 19.

Another output 22 of register select 70 is an input to frequency register 13 which has an output 25 to address latch 14. The digital data input in the form of binary "1's" or "0's" ("mark" or "space") appears on input line 24 which provides another input to address latch 14. Address latch 14 has an output 28 which serves as an input to logic array 40, an array of two read-only-memories (ROM's) and one programmable logic array (PLA). The array has an output 29 to down counter 16 which has an output 20 to segment counter 17 and also has an output 31 connected as an input to the down counter 16 itself and also an output 27 serving as another input to address latch 14. Segment counter 17 has an output 26 serving as still another input to address latch 14 and also has an output 32 serving as another input to wave generator 19. The down counter 16 has an output 33 also serving as an input to wave generator 19. The output of wave generator 19 is the desired synthesized wave.

In broad operational terms, the register select 70 receives information from the selection circuitry of the system in which the synthesizer is employed. In this preferred embodiment, the system is a modem for connection to a telephone line to provide communications in both directions and is fully described in copending U.S. patent application Ser. No. 811,657, filed June 30, 1977, entitled "CCD Filters and Modems Incorporating Such Filters" and assigned to the assignee of this invention. For example, the particular amplitude desired is selected and output 21 from the register select 70 provides the amplitude register 12 with this selection in binary form. Amplitude register 12 then provides a signal on output 23 to the amplitude adjust 18 which then, through a well known network of weighted, series resistive attenuation, provides a particular output reference voltage.

Having set the output voltage desired, the particular frequency pair required is selected by the system. For example, a common frequency pair consists of a 1070 Hz signal for the "mark" and a 1270 Hz signal for the "space". Then when a binary "1" is received on input 24, the output frequency to be provided is 1070 Hz. When a binary "0" is received on input 24, a sine wave having a frequency of 1270 Hz is provided. Address latch 14 provides the necessary addresses resulting from the signal on input 24 as well as the frequency pair information on line 25, segment count on line 26, and an end of segment indication on line 27. The logic array 40 then responds to the signals on output 28 from address latch 14 by providing on output 29 information to down counter 16 as to the period of the particular segment to be generated. Down counter 16 provides a signal to segment counter 17 over output 20 after each segment has been completed so that segment counter 17 maintains the current segment identification or count. Wave generator 19 is provided with the particular segment identification from segment counter 17 on output 32 and is also provided with the timing information from down counter 16 on output 33. Down counter 16, activated by a system clock having a frequency of 1 MHz counts in one microsecond intervals so that when the counter has counted down, for example, 58 or 59 (for a "mark" at 1070 Hz — to be described later) — it provides a signal to the segment counter signifying that the segment has ended and the next segment is now going to be counted. This information is also sent back to the down counter 16 itself to permit reloading it, and to the address latch 14 to provide a new address so that the next segment information is obtained from logic array 40. The segment sequence is never changed, nor the voltage amplitude assigned to it — only the period is a variable.

Figure 2A:
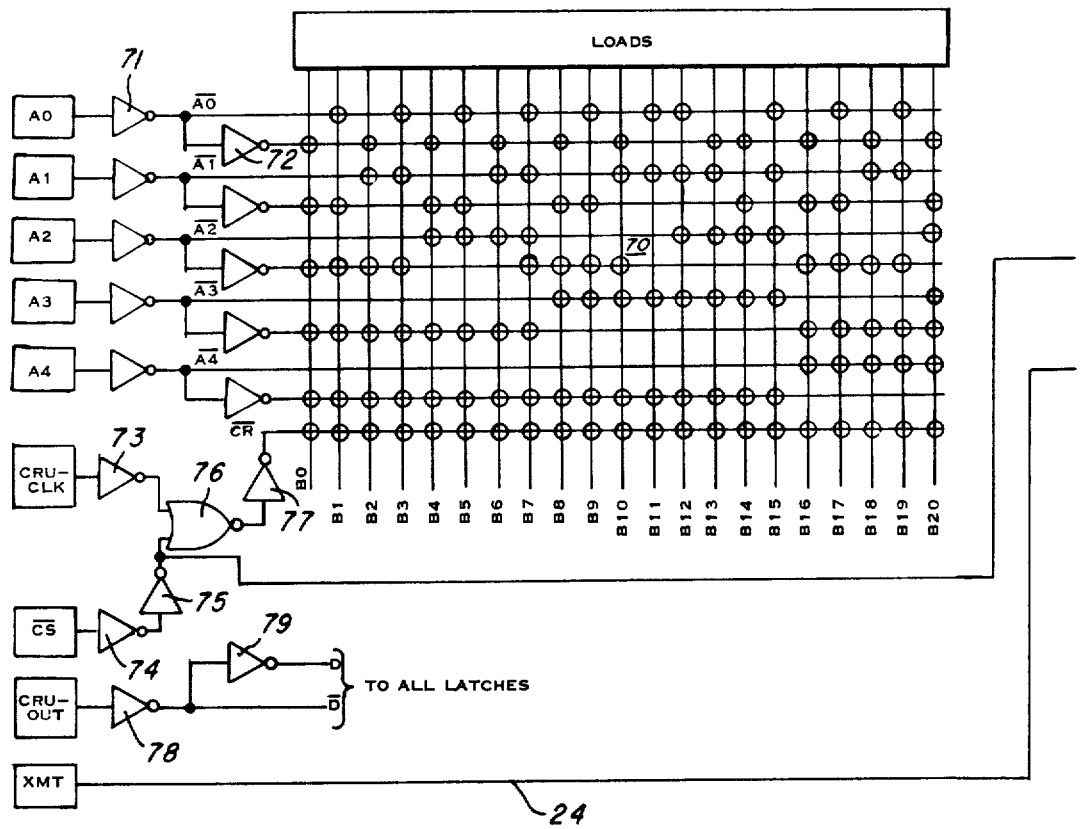
FIG. 2 illustrates the positional relationship between FIGS. 2a-2d which are a schematic diagram of FIG. 1.
Figure 2B:
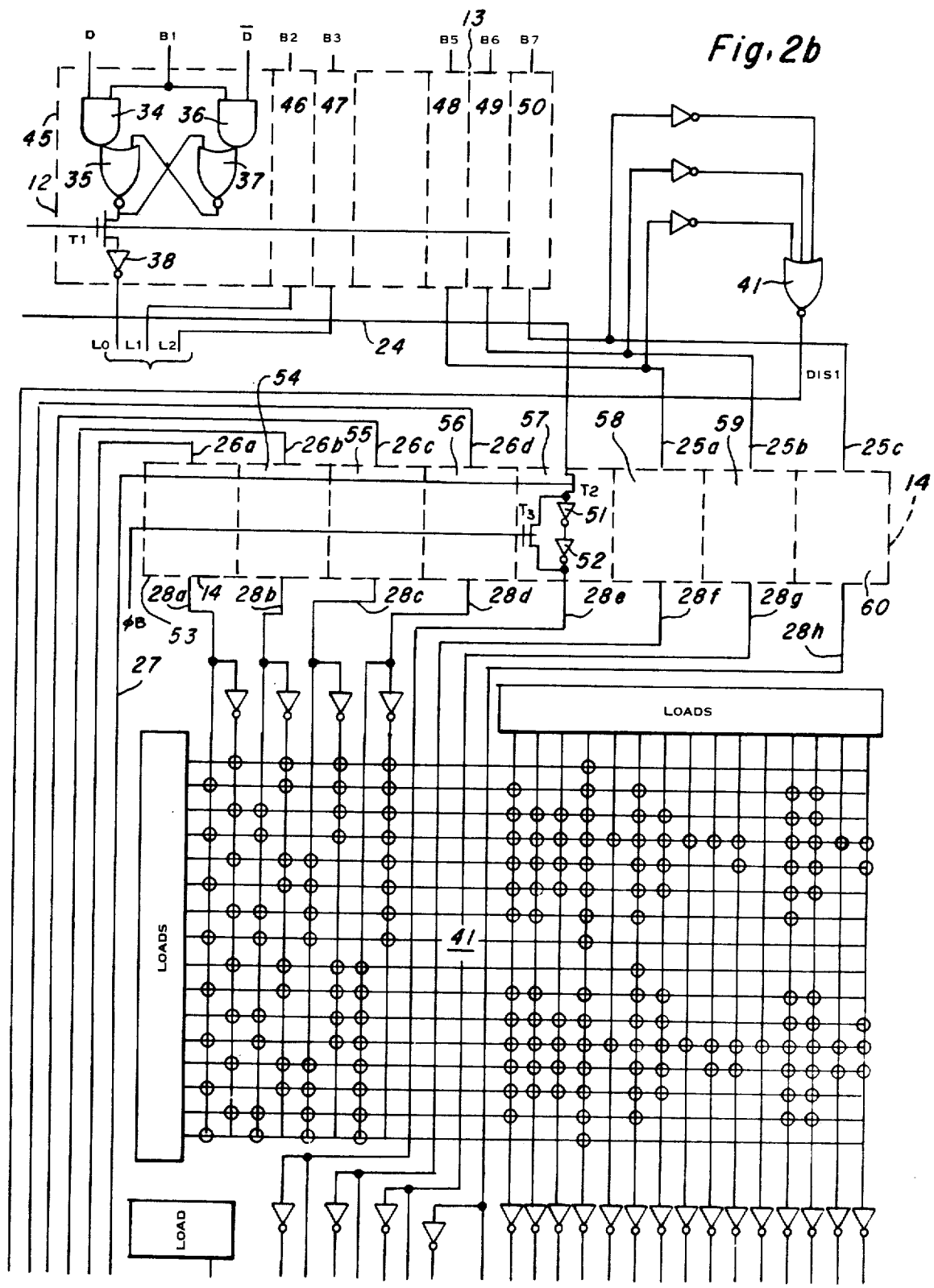
Figure 2C:
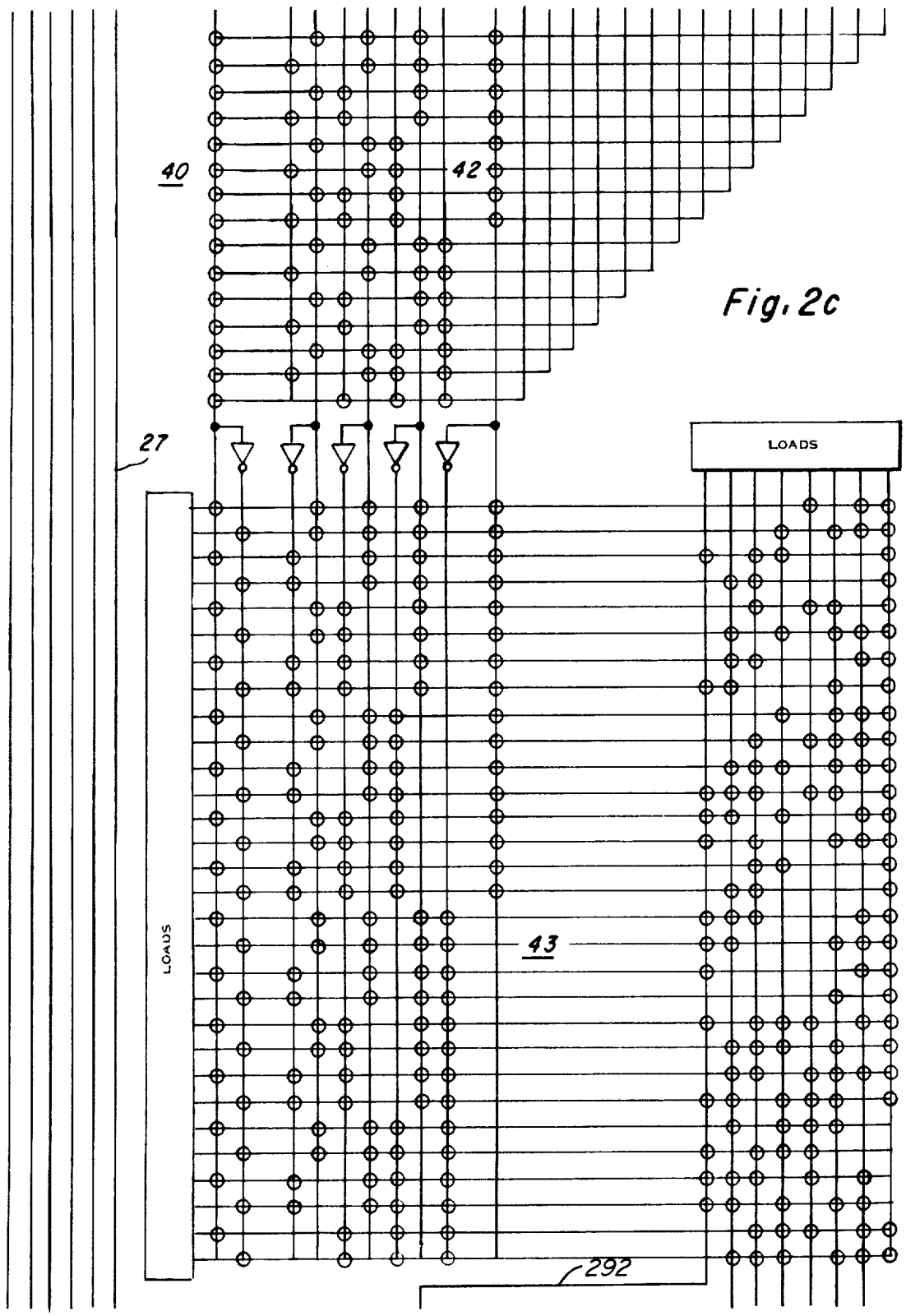

In FIG. 2, register select 70 shown is a well known programmable logic array (PLA) which need not be explained in detail. Shown in block form are inputs A0 through A4 with input A0 being inverted through inverter 71 to provide $\overline{A0}$ directly to PLA 70 and also inverted again through inverter 72 to provide A0 to PLA 70. A1 through A4 are treated exactly the same, that is, the particular signal and its inverse are provided. Inputs A0 through A4 come from the modem system itself and ultimately select the amplitude of the output sine wave and the pair of frequencies representing mark and space desired. Input "CRU-CLK" is a clock input from the communication register unit employed in the system which is inverted through inverter 73 and connected as an input to NOR circuit 76 whose output is inverted through inverter 77 for entry into PLA 70. This input is used for gating out of information from PLA 70.

Another input is "$\overline{CS}$" which is a chip select input used for selecting one of a plurality of wave generators and is inverted twice through inverters 74 and 75, serving as another input to NOR circuit 76 and also as a gating signal for amplitude register 12 and frequency register 13.

Another input "CRU-OUT" is a signal from the communication register unit mentioned above which is inverted through inverter 78 to provide signal "$\overline{D}$" and again through inverter 79 to provide signal "D" which enable the gates in amplitude register 12 and frequency register 13.

The outputs of PLA 70 are applied to amplitude register 12 and frequency register 13 as shown. Significant to this invention are outputs B5, B6 and B7 which are connected to frequency register 13. Amplitude register 12, to which outputs B1, B2 and B3 are connected is simply part of the apparatus for providing a desired amplitude of output waveform. Having the circuitry for selectively providing one of a plurality of available output amplitudes is an advantageous feature of this waveform generator, but is not germaine to the invention described herein. The remaining outputs are not of interest to this invention.

Output B1 is applied to stage 45 of frequency register 13. Output B1 is applied as an input to AND circuits 34 and 36, each of which also have an enabling input, D and $\overline{D}$, as mentioned above. AND circuit 34 serves as an input to NOR circuit 35 and AND circuit 36 serves as an input to NOR circuit 37. The output of NOR circuit 35 is applied as another input to NOR circuit 37, the output of which is applied as another input to NOR circuit 35, forming a latch. The channel of field effect transistor (FET) T1 connects the output of NOR circuit 35 to the input of inverter 38 whose output is designated L0. The gate of T1 is activated by the signal $\overline{CS}$ from the output of inverter 75.

Stages 46 and 47 which receive outputs B2 and B3, respectively, are identical to stage 45 and provide outputs designated L1 and L2, respectively. L0, L1 and L2 are outputs that are used to adjust to voltage level of the output waveform by application to the amplitude adjust 18.

Outputs B5, B6 and B7 are applied to frequency register 13, the stages of which are identical to stage 45 of amplitude register 12. Stages 48, 49 and 50 receive outputs B5, B6 and B7, respectively, and have outputs 25a, 25b, and 25c, respectively, which are applied to stages 58, 59 and 60, respectively, of address latch 14. Outputs 25a, 25b and 25c are also inverted and applied to NOR circuit 41 whose disable output (DIS) is applied to counter-to-segment decoder 140. Stage 57 of address latch 14 is identical to the other stages and therefore its description applies as well to stages 54–56 and 58–60.

FET T2 has its channel connected at one end to input line 24 and to the input of inverter 51 at the other, as well as to one end of the channel of FET T3. The output of inverter 51 serves as an input to inverter 52 whose output is connected to the other end of the channel of FET T3 and also serves as an input to ROM 41 of logic array 40. The gate of FET T2 is activated by a signal on line 27 clocked by clock pulse $\phi A$. The gate of FET T3 is activated by a clock pulse $\phi B$. Pulses $\phi A$ and $\phi B$ are provided by the system (not shown) and are two non-overlapping 1 MHz pulse trains. The inputs to stages 53, 54, 55 and 56 of address latch 14 are provided from segment counter 17 on lines 26a, 26b, 26c and 26d, respectively. Outputs 28a, 28b, 28c and 28d coming from stages 53 through 56, respectively, are applied directly and inverted to ROM 41. Outputs 28e, 28f, 28g, and 28h coming from stages 57, 58, 59 and 60, respectively, are applied directly and inverted to PLA 42. The outputs of PLA 42 are applied to ROM 43. ROM's 41 and 43 and PLA 42 form logic array 40. ROM's 41 and 42 are well known read-only-memories and need not be described in detail. PLA 42 is a programmable logic array and is also well known and need not be described in detail. Suffice it to say that the combination of devices provides storage for the pertinent information relating to the particular segments required for the corresponding frequencies. Outputs 29a through 29h from ROM 43 are applied to stages DC1 through DC7 of down counter 16. Stage DC1 is shown in detail and is identical to the remaining stages of down counter 16. Output 29a from ROM 43 is connected to the channel of FET T5, the other side of which is connected to one end of the channel of FET T6, and as an input to inverter 84 whose output is connected to one end of the channel of FET T4, the other end of which serves as an input to inverter 85, whose output is connected to stage DC 2 and which serves as one input to NOR circuit 62. The other end of the channel of FET T5 is connected as an input to NOR circuit 87. The output of stage DC7 serves as the other input to NOR circuit 62 and also serves as an input to AND circuits 63 as does the output of inverter 85 which is the output of stage DC1. The output of NOR circuit 62 serves as one input to NOR circuit 61 and the output of AND circuit 63 serves as the other input to NOR circuit 61 whose output is connected to the other side of the channel of T6. The gate of FET T5 is connected to line 31 which is connected to one end of the channel of FET T8. The gate of FET T6 is connected to one end of the channel of FET T7. The output from each of stages DC2 through DC6 are applied directly as additional inputs to NOR circuit 87 with the output from stage DC7 being inverted and then applied as an input to NOR circuit 87. The output of NOR circuit 87 serves as an input to NOR circuit 88 whose other input is simply a power up control pulse from the system.

The output of NOR circuit 88 is inverted through inverter 89, the output of which is connected to one end of the channel of FET T9 whose gate is activated by pulse φA and the other end of whose channel is inverted and applied to the gate of FET T7, the other end of whose channel is connected to the source of pulse φB. The other end of the channel of FET T9 is also inverted and connected to one end of the channel of FET T11 and inverted once more and connected to the gate of FET T8. The other end of the channel of T8 is connected to the source of pulse φB. The other end of the channel of FET T11 is connected to the gate of FET T12 and is also inverted and applied to the gate of FET T13. The one end of the channel of FET T12 is connected to line 33b and the other end is connected to the source of pulse φA. One end of the channel of FET T13 is also connected to the source of φA and the other end is connected to line 33a. Down counter 16 is a well known "psuedo-random" counter. The operation of this counter is also well known, and in this particular application the number of microseconds of the period of a particular segment is entered into the counter which then begins to decrement in one microsecond decrements. When counter 16 reaches "0", a signal is sent out on lines 31, 20a and 20b from FET T8 at time φB, on line 27 from FET T13 at time φA, and on lines 33a and 33b from FET's T13 and T12, respectively, at time φA.

Segment counter 17 is an ordinary counter having an input from down counter 16 on output 20 (lines 20a and 20b) as mentioned above so that each time down counter 16 reaches 0, a pulse is sent over line 20a at time φB and over line 20b at time φA to segment counter 17. Line 20a is connected to the gates of FET's T15, T16, T17, and T18. Line 20b is connected to the gates of FET's T21, T22, T23 and T24. NOR circuits 116, 117, 118 and 119 each have one input connected to the source of a system pulse for presetting the counter. The other input to NOR circuits 116 and 117 is through inverters 121 and 122, respectively, each of which is connected to the one end of the channel of FET's T21 and T22, respectively. The other input to NOR circuits 118 and 119 are connected to the one end of the channels of FET's T23 and T24, respectively. The output of NOR circuit 119 serves as the input to AND circuit 106 and is also connected to one end of the channel of FET T18. The output of NOR circuit 118 is connected as an input to NOR circuit 113 and as an input to AND circuit 106. The output of NOR circuit 117 is inverted through inverter 115 whose output is connected as an input to NOR circuit 112 and as an input to AND circuit 105. The output of NOR circuit 116 is inverted through inverter 114 whose output is connected as an input to NOR circuit 111 and as an input to AND circuit 104. The output of NOR circuit 113 is connected as an input to NOR circuit 103 and is also inverted through inverter 108 and applied as an input to AND circuit 105. The output of AND circuit 106 is applied as an input to NOR circuit 103 whose output is connected to one end of the channel of FET T17. The output of NOR circuit 112 and the output of AND circuit 105 serve as the inputs to NOR circuit 102 whose output is connected to one end of the channel of FET T16. The output of NOR circuit 112 also is inverted through inverter 107 and applied to AND circuit 104 as an input. The output of NOR circuit 111 and of AND circuit 104 serve as inputs to NOR circuit 101 whose output is connected to one end of the channel of FET T15.

The other end of the channel of FET T18 is connected as an input to inverter 130 whose output is inverted through inverter 131, and also connected to the one end of the channel of FET T28 whose gate is activated by pulse φA and whose other channel is connected in parallel with the output of inverter 131 to line 26a which is one output from segment counter 17. The other end of the channel of FET T17 is connected to one end of the channel of FET T27 whose gate is activated by pulse φA, and to inverter 128 whose output is inverted through inverter 129, the output of which is connected to the other end of the channel of FET T27 to output line 26b. The other end of the channels of FET's T15 and T16 are connected in a like manner to supply outputs on output lines 26c and 26d. Output line 26d is connected to one end of the channel of FET T29 whose gate is activated by pulse φA and the other end of whose channel is inverted through inverter 132 and connected to one end of the channel of FET T31 whose gate is activated by pulse φB. The other end of the channel of FET T31 is inverted through inverter 133 whose output is connected to line 32.

Segment counter 17 is a typical counter which, in this preferred embodiment, is capable of counting from 0 through 15, for a total count of 16.

Amplitude adjust 18 of FIG. 1 which receives outputs L0, L1, and L2 from stages 45, 46 and 47 of amplitude register 12 provides a voltage reference amplitude to wave generator 19 and is not important to this invention. Therefore, no description of amplitude adjust 18 is made herein. It is a weighted, series resistive attenuation circuit, well known in the art.

Wave generator 19 of FIG. 1 is comprised of counter to segment decoder 140 of FIG. 2d, inverter switches S1 through S7, capacitors CA through CG and clocked ground biased node 150. Counter to segment decoder 140 is connected to output 32 from segment counter 17 and also to output 33a and 33b from down counter 16. Stages of counter segment decoder 140 are connected, respectively, to switches S1, S2, S3, S4, S5, S6 and S7, the output of which are connected respectively to one terminal of capacitors CA, CB, CC, CD, CE, CF and CG, the other terminals of which are connected together on line 148 to one end of the channel of FET T32, the other end of which provides the output of the wave generator and is connected to clocked ground biased node 150. The gate of FET T32 is activated by an inverted signal on the DIS line.

Counter segment decoder 140 is a simple shift register which, when activated by a pulse, stores a "1" until another pulse is received at which time the first "1" is shifted and a second "1" is also stored, continuing in this fashion until completely filled with "1's". This type of register is also referred to as a "Jones" counter.

Referring now to FIG. 3, the first stage of counter segment decoder 140 together with switch S1 is illustrated schematically. A $\overline{\text{DIS}}$ input is connected to the gate of FET T33, one side of whose channel is grounded, the other side being connected to output 32 from segment counter 17. Output line 32 is connected to one end of the channel of FET T34, the other end of which is inverted through inverter 141 and again through 142 and connected to the gate of FET T40 of switch S1. The other end of the channel of FET T34 is also connected to one end of the channel of FET T35 whose gate is activated by pulse $\phi$B, the other end of whose channel is connected to the gate of FET T40. Output line 33a from down counter 16 is connected to the gate of FET's T34 and T37. Output line 33b from down counter 16 is connected to the gate of FET T36. One end of the channel of FET T36 is connected to the gate of FET T40 and the other end is inverted through inverter 143 and again through 144 and connected to one end of the channel of FET T37. The other end of the channel of FET T37 is inverted through inverters 145 and 146 and is also connected to one end of the channel of FET T42 whose other end is connected to the output of inverter 146 which is then connected to switch S2.

One end of the channel of FET T40 of switch S1 is connected to ground and the other end is connected to the one end of the channel of FET T38 and also to the gate of FET T39. The other end of the channel of FET T38 is connected to a source of voltage and to its gate. One end of the channel of FET T39 is connected to a reference voltage, setting the maximum amplitude of the output sine wave. The other end of the channel of FET T39 is connected to one plate of capacitor CA and to one end of the channel of FET T41, the other end of which is grounded. The other plate of capacitor CA is connected to line 148. The remaining stages of counter-to-segment decoder 140 are identical to that described above as are the remaining switches S2 through S7 to switch S1.

FIG. 4 is a schematic diagram of the blocked ground biased node 150 of FIG. 2. The circuit is used simply to prevent a DC component from building up and thereby shifting the output waveform. The output line which carries the output waveform is connected to one side of the channel of FET T50 whose other side is connected to one plate of capacitor C1 whose other plate is connected to ground. The other side of the channel of FET T50 is also connected to one side of the channel of FET T51, the other side of which is connected to ground. FET's T50 and T51 are used for charging capacitor C1 and discharging it, respectively. The gate of FET T50 is connected to one end of the channel of FET T54 and the gate of FET T51 is connected to one end of the channel of the FET T52. The other ends of the channels of FET's T52 and T54 are connected to a voltage source. The gate of FET T52 is enabled by pulse $\phi$B and the gate of FET T54 is enabled by pulse $\phi$A. FET T56 has one end of its channel connected to the channel of FET T57 and to the gates of FET's T57, T55 and T53. The other end of the channel of FET T56 is connected to its gate and to ground. The other end of the channel of FET T57 is connected to another voltage source. One end of the channel of FET T55 is connected to the gate of FET T50 and one end of the channel of FET T53 is connected to the gate of FET T50 and one end of the channel of FET T53 is connected to the gate of FET T51. The other ends of the channels of FET's T53 and T55 are connected together to the other voltage source.

FET's T53, T55, T56 and T57 are used for biasing of this circuit so that a reference is established at the gates of FET's T50 and T51 so that those FETs are turned completely on and off.

As indicated above, pulses $\phi$A and $\phi$B are non-overlapping. When FET T54 is turned on by $\phi$A, FET T50 is turned on. The output is connected to the capacitors CA through CG and when FET T50 is turned on, some of the charge from those capacitors charges small capacitor C1. Then FET T52 is turned on by pulse $\phi$B, after FET T54 has been turned off. When T52 is turned on, FET T51 is also turned on, thus discharging capacitor C1 to ground. These two FET's T50 and T51 form switches with capacitor C1 between them. The circuit then simulates an RC network. The two switches, FET's T50 and T51, together with capacitor C1, may be considered as an equivalent resistance of high and precise value. This type of network therefore isolates the AC components from ground, but keeps the DC level at ground. In this way, the output waveform is centered around ground as a reference and remains centered around ground.

MODE OF OPERATION OF THE INVENTION

The capacitors CA through CG of the waveform generator 19 of FIG. 1 are selected to provide predetermined points on the desired output waveform. In this preferred embodiment, a total of 16 segments makes up one cycle of the output sine wave. Therefore, there are eight steps from the highest positive value from ground to the highest negative value from ground. Going from the highest negative value to the highest positive value is a mirror image of the aforementioned eight steps. A total of only seven capacitors is therefore necessary. The steps on the output sine wave are calculated on the basis of area. The basic integral for area is expressed as:

$$\text{Area} = \frac{1}{T} \int_0^T f(x) dx$$

For the specific waveform, $\sin\omega t$, equal x increments dictate that $T = (\pi/2 - 0)/4 = \pi/8$ rad or $22\frac{1}{2}°$.

On the basis of a $22\frac{1}{2}°$ spacing:

$$\text{Area 1} = \frac{8}{\pi} \int_0^{\frac{\pi}{8}} \sin x \, dx =$$

-continued $$\frac{8}{\pi}\left[-\cos\frac{\pi}{8}-(-\cos 0)\right]=\frac{8}{\pi}$$

Area 1 = 0.1938391787

Using the same calculation technique, $$\text{Area 2} = \frac{8}{\pi}\left[-\cos\frac{\pi}{4}-(-\cos\frac{\pi}{8})\right]=$$

$$\frac{8}{\pi}\left[\cos\frac{\pi}{8}-\cos\frac{\pi}{4}\right]=0.5520072784$$

$$\text{Area 3} = \frac{8}{\pi}\left[-\cos\frac{3\pi}{8}-(-\cos\frac{\pi}{4})\right]=$$

0.8261372739

$$\text{Area 4} = \frac{8}{\pi}\left[-\cos\frac{\pi}{2}-(-\cos\frac{3\pi}{8})\right]=$$

0.9744953584

Having determined these values of areas for the stages forming the sine wave, the values of capacitors CA through CG may be determined. The first step

Δ1 = 0.97449 − 0.82614 = 0.14835

Δ2 = 0.82614 − 0.55201 = 0.27413

Δ3 = 0.55201 − 0.19384 = 0.35817

Δ4 = 0.19384 − 0 = 0.19384

Δ5 = 0.19384

Δ6 = 0.35817

Δ7 = 0.27413

Δ8 = 0.14835

Assume a convenient value of capacitance of 1.0 pf for capacitor CA to cause Δ1 = 0.14835. This value is selected because of manufacturing and size restraints, and for impedance matching to the next stage. Then the capacitance values can all be proportioned based on CA = 1.0 pf and Δ = 0.14835.

$$CB = CF = \frac{0.27413}{0.14835} = 1.85 \, pf$$

$$CC = CE = \frac{0.35817}{0.14835} = 2.41 \, pf$$

$$CD = \frac{0.38766}{0.14835} = 2.61 \, pf$$

Referring to FIG. 3, when there is a "1" present in stage one of the counter-to-segment decoder 140 and when S1 is activated, capacitor CA discharges causing Δ1 which provides the first step down on the generated wave. Similarly, when there is a "1" in stage two of the counter-to-segment decoder 140, capacitor C2 discharges providing Δ2. The counter-to-segment decoder 140 is loaded sequentially with "1's" and "0's" as follows:

| Segment | STAGE | | | | | | |
|---|---|---|---|---|---|---|---|
| | 1 | 2 | 3 | 4 | 5 | 6 | 7 |
| 5 | 1 | 1 | 1 | 1 | 1 | 1 | 1 |
| 6 | 0 | 1 | 1 | 1 | 1 | 1 | 1 |
| 7 | 0 | 0 | 1 | 1 | 1 | 1 | 1 |
| 8 | 0 | 0 | 0 | 1 | 1 | 1 | 1 |
| 9 | 0 | 0 | 0 | 0 | 1 | 1 | 1 |
| 10 | 0 | 0 | 0 | 0 | 0 | 1 | 1 |
| 11 | 0 | 0 | 0 | 0 | 0 | 0 | 1 |
| 12 | 0 | 0 | 0 | 0 | 0 | 0 | 0 |
| 13 | 0 | 0 | 0 | 0 | 0 | 0 | 0 |
| 14 | 1 | 0 | 0 | 0 | 0 | 0 | 0 |
| 15 | 1 | 1 | 0 | 0 | 0 | 0 | 0 |
| 16 | 1 | 1 | 1 | 0 | 0 | 0 | 0 |
| 1 | 1 | 1 | 1 | 1 | 0 | 0 | 0 |
| 2 | 1 | 1 | 1 | 1 | 1 | 0 | 0 |
| 3 | 1 | 1 | 1 | 1 | 1 | 1 | 0 |
| 4 | 1 | 1 | 1 | 1 | 1 | 1 | 1 |

FIG. 5 illustrates the synthesized sine wave showing the 16 segments forming a space, followed by a shift from space to mark illustrating, in exaggerated form, a lower frequency corresponding to a mark.

As an example to illustrate the operation of the wave generator, assume that the mark frequency is 1070 Hz and that the space frequency is 1270 Hz. The respective total waveform periods are:

$$\text{mark} = \frac{1}{f} = \frac{1}{1070 \text{ Hz}} = 935 \text{ microseconds}$$

$$\text{space} = \frac{1}{f} = \frac{1}{1270 \text{ Hz}} = 787 \text{ Microseconds}$$

As set out earlier:

(1) $1/f = Ax+By$, where $x+y = 16$ and $B = A+1$

In the case of the mark, to calculate A:

$$A \text{ (approx)} = \frac{\text{Waveform Period}}{\text{No. of Segments}} =$$

$$\frac{935}{16} = 58.44 \text{ Microseconds}$$

A = 58 Microseconds

B = A+1 = 59 Microseconds

Empirically, let x = 9 and y = 7
Substituting in equation (1) above, $1/f = 58 \times 9 + 59 \times 7 = 935$ Microseconds Calculating in the same fashion for space,
A (approx) = 787/16 = 49.2 Microseconds A = 49 Microseconds B = A+1 = 50 Microseconds Empirically, let x = 13 and y = 3.
Then, substituting in equation (1), $1/f = 49 \times 13 + 50 \times 3 = 787$ Microseconds From the above calculations, it is apparent that by having segments of two different periods to form a waveform, the period of the waveform can be very accurately synthesized, thereby forming a highly accurate output frequency. It should be understood that other pairs of frequencies are required to be generated by this type of waveform generator. For example, 1180 Hz and 980 Hz, 1850 Hz and 1650 Hz, 2025 Hz and 2225 Hz. In all cases, the segment periods are determined in exactly the same fashion as described above for 1070 Hz and 1270 Hz.

The A and B period information for all of the pairs of frequencies that will be required are stored in the logic array 40. Although corresponding segment periods differ, the amplitudes do not. For example, segment 4 of a space signal at 1270 Hz is 49 or 50 microseconds. Segment 4 of the corresponding mark frequency of 1970 Hz is 58 or 59 microseconds. For a space frequency of 1850 Hz, the segment 4 period is 34 or 35 microseconds. The period of segment 4 for the corresponding mark frequency of 1650 Hz is 38 or 39 microseconds. Very important is the fact that for each of these number 4 segments, the amplitude is exactly the same, assuming that the same reference voltage is applied to the waveform generator. This feature is very important when frequencies are shifted. Also, because of commonality between the segments with respect to mirror images and identify of amplitude, it is possible and practical in logic array 40 to use a programmable logic array 42 which permits some logic manipulation, thereby reducing the total number of components required for storage.

Referring now to FIGS. 2 and 5, assume first that the frequency pair selected is 1270 Hz for space and 1070 for mark. Further, assume that a digital "0" is applied on line 24, signifying a space. If this is the first signal entry after having applied power to the modem, then it can be assumed that the output from the segment counter is zero and that zeros are on all of lines 26a–26d. Those four outputs to stages 53–56 of address latch 14 determine that segment 1 is addressed. Outputs 25a–25c from frequency register 13 are applied to stages 58–60 of address latch 14 to select the frequency pair of 1270-1070 Hz. Finally, line 24 is an input to stage 57 of address latch 14 to establish that the input binary signal is a space as indicated in FIG. 5. Address latch 14 provides inputs 28a–28h with segment number, space signal and frequency pair information so that the appropriate segment period designation is transmitted from logic array 40 on lines 29a–29h to down counter 16. The number 49, in this instance, is entered into down counter 16. The clock input of one MHz to down counter 16 causes down counter 16 to count down in one microsecond intervals. During the time that the counting is being carried on, segment counter 17 remains in its original preset state and the appropriate combination of switches S1-S4 are activated, as shown in the preceding chart, together with the first four stages of counter-to-segment decoder 140, with capacitors CA-CD thereby being included. The appropriate voltage output level then is output on line 48 through FET T32, with the DC ground being kept constant by the clock ground biased node 150.

When down counter 16 reaches 0, segment counter 17 is activated by pulses on lines 38a and 33b to increment by 1. Such incrementing provides new information on lines 26a–26d, thereby providing a changed address in stages 53–56 of address latch 14. This results in segment number 2 period information in the form of a binary word being transmitted into down counter 16. Thus, segment 2 would be presented at the output with a voltage level dependent upon the combination of switches S1-S5, stages 1-5 and capacitors CA-CE.

Segment counting then would continue until point M on FIG. 5 when the input information on line 24 changes from a "space" to a "mark". On FIG. 5, it is seen that the change occurs at approximately the midpoint of segment 2 of the second space waveform. No change occurs in the output of logic array 40 at that time. However, at the end of that particular segment 2, the new segment 3 address is presented to address latch 14, together with the new binary information input. The new binary information input signifying a mark, together with the frequency pair information and the address information results in a different segment 3 from that ordinarily following in the space mode. It should be understood that the time for response to such a change may be as described, or may be one later, depending upon the number of stages and types of hardware implementation. It is important to understand that, in any event, there is no change in the sequence of segments.

As described, segment number 3 period of 58 microseconds is loaded into down counter 16. Down counter 16 then counts down until it gets to 0 and the cycle is repeated with segment number 4 being next selected. The segments, as discussed above are in periods of 58 and 59 microseconds. Nine of the 58 microsecond segments have interspersed strategically between them seven of the segments having 59 microsecond periods. Likewise, in the mark case, thirteen of the segments have periods of 49 microseconds having three segments of 50 microseconds strategically interleaved therewith to provide a smooth sine wave output.

The output waveform is almost totally free of harmonics and noise as a result of the careful frequency generation and the lack of noise when shifting from one frequency to another.

The particular invention involved herein employs MOS transistors. It is contemplated that other type field effect transistors and bilateral transistors could be employed. Also, different types of ROM's and PLA's could be used and certainly other types of registers, counters and logic configurations. These deviations are contemplated and do not depart from the scope of this invention.

What is claimed is:

1. A multi-frequency digital wave synthesizer, including a system clock, for providing one of a plurality of analog output signals made up of n successive segments wherein n is an integer greater than one, in response to a corresponding electrical digital signal input, comprising:
(a) logic array means for storing and providing a binary representation of the period of a selected segment of any of the plurality of output signals;
(b) addressing means operatively connected to receive a binary identification of a selected segment, to the logic array means and to the digital signal input for addressing a selected segment, whereby the logic array means provides a binary representation of the period of the selected segment;
(c) segment period determining means, operatively connected to the output of the logic array means and responsive to the binary representation for providing in real time the period of the selected segment;
(d) segment selecting means connected to receive and responsive to the output of the segment period determining means, for successively providing a binary identification of each of the n segments, having output means operatively connected to the addressing means; and
(e) wave generator means, operatively connected to the output means of the segment selecting means for identifying the segment and to the output of the segment period determining means for providing the real time period, for selectively providing a predetermined voltage corresponding to the selected segment period, successively, for each of the n segments thereby forming one of the plurality of analog output signals.

2. The synthesizer of claim 1 wherein the segment period determining means comprises a counter, responsive to the binary representation, activated by electrical pulses from the system clock, to count a number of the electrical pulses corresponding to the binary representation thereby providing the real time period.

3. The synthesizer of claim 2 wherein the counter is a decrementing counter, originally loaded from the logic array means with the binary representation, that provides an indicia pulse to the segment counting means when the count of the binary representation has been completed thereby indicating that a segment has been completed.

4. The synthesizer of claim 1 wherein the addressing means comprises:
(b) (i) address register select means having inputs for selecting the output frequencies desired; and
(ii) address register means, responsive to the address register select means and to the segment selecting means for addressing the logic array means.

5. The synthesizer of claim 2 wherein the addressing means comprises:
(b) (i) address register select means having inputs for selecting the output frequencies desired; and
(ii) address register means, responsive to the address register select means and to the segment selecting means for addressing the logic array means.

6. The synthesizer of claim 1 wherein the segment selecting means comprises a counter for sequentially counting the occurrence of the segments.

7. The synthesizer of claim 2 wherein the segment selecting means further comprises a counter for sequentially counting the segments.

8. The synthesizer of claim 4 wherein the segment selecting means comprises a counter for sequentially counting the occurrence of the segments.

9. The synthesizer of claim 5 wherein the segment selecting means further comprises a counter for sequentially counting the occurrence of the segments.

10. The synthesizer of claim 1 wherein the wave generator means further comprises:
(e) (i) a capacitor ladder network comprising a plurality of capacitors having their first terminals connected together to a common point;
(ii) a source of reference voltage; and
(iii) a register, selectively loadable from the segment selecting means, each stage of the register being connected to the second terminal of a respective one of the plurality of capacitors and to the reference voltage, the capacitor values being selected to provide an output voltage when the associated stage is loaded, such that the desired analog output signal is sequentially produced as the stages of the register are loaded.

11. The synthesizer of claim 2 wherein the wave generator means comprises:
(e) (i) a capacitor ladder network comprising a plurality of capacitors having their first terminals connected together to a common point;
(ii) a source of reference voltage; and
(iii) a register, selectively loadable from the segment selecting means, each stage of the register being connected to the second terminal of a respective one of the plurality of capacitors and to the reference voltage, the capacitor values being selected to provide an output voltage when the associated stage is loaded, such that the desired analog output signal is sequentially produced as the stages of the register are loaded.

12. The synthesizer of claim 5 wherein the wave generator means comprises:
(e) (i) a capacitor ladder network comprising a plurality of capacitors having their first terminals connected together to a common point;
(ii) a source of reference voltage; and
(iii) a register, selectively loadable from the segment selecting means, each stage of the register being connected to the second terminal of a respective one of the plurality of capacitors and to the reference voltage, the capacitor values being selected to provide an output voltage when the associated stage is loaded, such that the desired analog output signal is sequentially produced as the stages of the register are loaded.

13. The synthesizer of claim 7 wherein the wave generator means comprises:
(e) (i) a capacitor ladder network comprising a plurality of capacitors having their first terminals connected together to a common point;
(ii) a source of reference voltage; and
(iii) a register, selectively loadable from the segment selecting means, each stage of the register being connected to the second terminal of a respective one of the plurality of capacitors and to the reference voltage, the capacitor values being selected to provide an output voltage when the associated stage is loaded, such that the desired analog output signal is sequentially produced as the stages of the register are loaded.

14. The synthesizer of claim 9 wherein the wave generator means comprises:
(e) (i) a capacitor ladder network comprising a plurality of capacitors having their first terminals connected together to a common point;
(ii) a source of reference voltage; and
(iii) a register, selectively loadable from the segment selecting means, each stage of the register being connected to the second terminal of a respective one of the plurality of capacitors and to the reference voltage, the capacitor values being selected to provide an output voltage when the associated stage is loaded, such that the desired analog output signal is sequentially produced as the stages of the register are loaded.

15. The synthesizer of claim 1 wherein the logic array comprises a programmable logic array (PLA).

16. The synthesizer of claim 15 wherein the logic array means further comprises a read-only-memory (ROM).

17. The synthesizer of claim 14 wherein the logic array comprises a programmable logic array (PLA).

18. The synthesizer of claim 17 wherein the logic array means further comprises a read-only-memory (ROM).

19. An electronic multi-frequency digital wave synthesizer, implemented as integrated circuitry in semiconductor substrate material, including a system clock, for providing one of a plurality of analog output signals made up of n successive segments wherein n is an interger greater than one, in response to a corresponding electrical digital signal input, comprising:

(a) logic array means for storing and providing a binary representation of the period of a selected segment of any of the plurality of output signals, wherein the n segments of each of the plurality of output signals equals x segments + y segments wherein x and y are integers and wherein the n segments of each of the plurality of output signals are divided into A periods and B periods wherein A and B are different integers;

(b) addressing means operatively connected to receive a binary identification of a selected segment, to the logic array means for addressing a selected segment, whereby the logic array means provides a binary representation of the period of the selected segment;

(c) segment period determining means operatively connected to the output of the logic array means and responsive to the binary representation for providing in real time the A period or the B period of the selected segment;

(d) segment counting means responsive to the segment period determining means, for sequentially counting the occurrence of each segment and providing at its output a binary count thereof to the addressing means; and (e) voltage wave generator means, operatively connected to the output of the segment counting means for identifying the segment and to the output of the segment period determining means for providing successively n/2 predetermined voltages each corresponding to a selected segment for the duration (A and B) of the segment period for each of the n segments.

20. The synthesizer of claim 19 wherein $B = A + 1$, in microseconds.

21. The synthesizer of claim 20 wherein $x + y = n = 16$.

22. The synthesizer of claim 19 wherein the segment period determining means comprises a counter, responsive to the binary representation, activated by electrical pulses from the system clock to count a number of electrical pulses to provide the real time period corresponding to the binary representation of A and B.

23. The synthesizer of claim 22 wherein the counter is a decrementing counter, originally loaded from the logic array means with the binary representation, that provides an indicia pluse to the segment counting means when the count of the binary representation has been completed thereby indicating that a segment has been completed.

24. The synthesizer of claim 19 wherein the addressing means comprises:
(b) (i) address register select means having inputs for selecting the output frequencies desired; and
(ii) address register means, responsive to the address register select means and to the segment counting means for addressing the logic array means.

25. The synthesizer of claim 22 wherein the addressing means comprises:
(b) (i) address register select means having inputs for selecting the output frequencies desired; and
(ii) address register means, responsive to the address register select means and to the segment counting means for addressing the logic array means.

26. The synthesizer of claim 19 wherein the wave generator means comprises:

(e) (i) a capacitor ladder network comprising a plurality of capacitors having their first terminals connected together to a common point;
(ii) a source of reference voltage; and
(iii) a register, selectively loadable from the segment counting means, each stage of the register being connected to the second terminal of a respective one of the plurality of capacitors and to the reference voltage, the capacitor values being selected to provide an output voltage when the associated stage is loaded, such that the desired analog output signal is sequentially produced as the stages of the register are loaded.

27. The synthesizer of claim 22 wherein the wave generator means comprises:
(e) (i) a capacitor ladder network comprising a plurality of capacitors having their first terminals connected together to a common point;
(ii) a source of reference voltage; and
(iii) a register, selectively loadable from the segment counting means, each stage of the register being connected to the second terminal of the respective one of a plurality of capacitors and to the reference voltage, the capacitor values being selected to provide an output voltage when the associated stage is loaded, such that the desired analog output signal is sequentially produced as the stages of the register are loaded.

28. The synthesizer of claim 24 wherein the wave generator means comprises:
(e) (i) a capacitor ladder network comprising a plurality of capacitors having their first terminals connected together to a common point;
(ii) a source of reference source; and
(iii) a register, selectively loadable from the segment counting means, each stage of the register being connected to the second terminal of a respective one of the plurality of capacitors and to the reference voltage, the capacitor values being selected to provide an output voltage when the associated stage is loaded, such that the desired analog output signal is sequentially produced as the stages of the register are loaded.

29. The synthesizer of claim 25 wherein the wave generator means comprises:
(e) (i) a capacitor ladder network comprising a plurality of capacitors having their first terminals connected together to a common point;
(ii) a source of reference source; and
(iii) a register, selectively loadable from the segment counting means, each stage of the register being connected to the second terminal of a respective one of the plurality of capacitors and to the reference voltage, the capacitor values being selected to provide an output voltage when the associated stage is loaded, such that the desired analog output signal is sequentially produced as the stages of the register are loaded.

30. The synthesizer of claim 19 wherein the logic array means comprises a programmable logic array (PLA).

31. The synthesizer of claim 30 wherein the logic array means further comprises a read-only-memory (ROM).

32. The synthesizer of claim 21 wherein the logic array means comprises a programmable logic array (PLA).

33. The synthesizer of claim 32 wherein the logic array means further comprises a read-only-memory (ROM).

34. In a multi-frequency digital wave synthesizer for providing one of a plurality of analog output signals made up of n successive segments wherein n is an integer greater than one, in response to a corresponding electrical digital signal input, the method of providing an analog output signal comprising the steps of:
  (a) storing in logic array means the binary representation of the periods of the n successive segments for all of the plurality of analog output signals;
  (b) addressing the logic array means including inputting the digital signal input to provide the binary representation of the addressed segment;
  (c) changing the binary representation provided from the logic array means to the segment period in real time by counting a counter using a fixed frequency;
  (d) selecting a voltage level and providing that level as an output during the segment period to form one of the plurality of analog output signals;
  (e) counting the segments and providing the next count to the logic array means to address the next sequential segment; and
  (f) repeating steps b through e until the waveform has been completed.

35. The method of claim 34 including the following additional steps after step (e);
  (g) addressing a different segment in response to a change in the input digital signal;
  (h) maintaining the sequence of the segment count.

36. A multi-frequency digital sine wave synthesizer, including a system clock, for providing one of a plurality of analog output signals made up of n successive segments wherein n is an integer greater than one, in response to a corresponding electrical digital signal input, comprising:
  (a) logic array means for storing and providing a binary representation of the period of a selected segment of any of the plurality of output signals;
  (b) addressing means operatively connected to receive a binary identification of a selected segment, to the logic array means and to the digital signal input for addressing a selected segment, whereby the logic array means provides a binary representation of the period of the selected segment;
  (c) segment period determining means, operatively connected to the output of the logic array means and responsive to the binary representation for providing in real time the period of the selected segment;
  (d) segment selecting means connected to receive and responsive to the output of the segment period determining means, for successively providing a binary identification of each of the n segments, having output means operatively connected to the addressing means; and
  (e) wave generator means, operatively connected to the output means of the segment selecting means for identifying the segment and to the output of the segment period determining means for providing the real time period, for selectively providing a predetermined voltage corresponding to the selected segment period, successively, for each of the n segments thereby forming one of the plurality of analog output signals, a wave generator means comprising:
    (i) a capacitor ladder network comprising a plurality of capacitors having their first terminals connected together to a common point;
    (ii) a source of reference voltage; and
    (iii) a register, selectively loadable from the segment selecting means, each stage of the counter being connected to the second terminal of a respective one of a plurality of capacitors and to the reference voltage, the capacitor values being selected to provide an output voltage when the associated stage is loaded, such that the desired analog output signal is sequentially produced as the stages of the register are loaded.

37. The synthesizer of claim 36 wherein the segment period determining means comprises a counter, responsive to the binary representation, activated by electrical pulses from the system clock, to count a number of the electrical pulses corresponding to the binary representation thereby providing the real time period.

38. The synthesizer of claim 37 wherein the addressing means comprises:
  (b) (i) address register select means having inputs for selecting the output frequency desired; and
  (ii) address register means, responsive to the address register select means and to the segment selecting means for addressing the logic array means.

39. The synthesizer of claim 37 wherein the segment selecting means comprises a counter for sequentially counting the occurrence of the segments.

40. The synthesizer of claim 38 wherein the segment selecting means comprises a counter for sequentially counting the occurrence of the segments.

41. The synthesizer of claim 40 wherein the logic array means comprises a programmable logic array (PLA).

42. The synthesizer of claim 41 wherein the logic array means further comprises a read-only-memory (ROM).

43. An electronic multi-frequency digital sine wave synthesizer, implemented as integrated circuitry in semiconductor substrate material, including a system clock, for providing one of a plurality of analog output signals made up of n successive segments wherein n is an integer greater than one in response to a corresponding electrical digital input, comprising:
  (a) logic array means for storing and providing a binary representation of the period of a selected segment of any of the plurality of output signals, wherein the n segments of each of the plurality of output signals x segments + y segments wherein x and y are integers and wherein the n segments of each of the plurality of output signals are divided into A periods and B periods wherein A and B are different integers;
  (b) addressing means operatively connected to receive a binary identification of a selected segment and to the logic array means for addressing a selected segment, whereby the logic array means provides a binary representation of the period of the selected segment;
  (c) segment period determining means operatively connected to the output of the logic array means in response to the binary representation for providing in real time the A period or the B period of the selected segment;
  (d) segment counting means responsive to the segment period determining means, for sequentially counting the occurrence of each segment and providing at its output a binary count thereof to the addressing means; and (e) voltage wave generator means, operatively connected to the output means of the segment selecting means for identifying the segment and to the output of the segment period determining means for providing the real time period, for selectively providing a predetermined voltage corresponding to the selected segment period, successively, for each of the n segments thereby forming one of the plurality of analog output signals, a wave generator means comprising:
  (i) a capacitor ladder network comprising a plurality of capacitors having their first terminals connected together to a common point;
  (ii) a source of reference voltage; and
  (iii) a register, selectively loadable from the segment selecting means, each stage of the counter being connected to the second terminal of a respective one of a plurality of capacitors and to the reference voltage, the capacitor values being selected to provide an output voltage when the associated stage is loaded, such that the desired analog output signal is sequentially produced as the stages of the register are loaded.

44. The synthesizer of claim 43 wherein the segment period determining means comprises a counter, responsive to the binary representation, activated by electrical pulses from the system clock, to count a number of the electrical pulses corresponding to the binary representation thereby providing the real time period.

45. The synthesizer of claim 43 wherein the addressing means comprises:
  (b) (i) address register select means having inputs for selecting the output frequency desired; and
  (ii) address register means, responsive to the address select means and to the segment selecting means for addressing the logic array means.

46. The synthesizer of claim 44 wherein the segment period determining means comprises a counter, responsive to the binary representation, activated by electrical pulses from the system clock, to count a number of electrical pulses corresponding to the binary representation thereby providing the real time period.

* * * * *